United States Patent
DiSalvo et al.

[11] Patent Number: 5,868,837
[45] Date of Patent: Feb. 9, 1999

[54] LOW TEMPERATURE METHOD OF PREPARING GAN SINGLE CRYSTALS

[75] Inventors: Francis J. DiSalvo, Ithaca, N.Y.; Hisanori Yamane, Sendai, Japan; Jay Molstad, Ithaca, N.Y.

[73] Assignee: Cornell Research Foundation, Inc., Ithaca, N.Y.

[21] Appl. No.: 6,431

[22] Filed: Jan. 13, 1998

Related U.S. Application Data

[60] Provisional application No. 60/035,713 Jan. 17, 1997.

[51] Int. Cl.$^6$ ............................................. C30B 29/38
[52] U.S. Cl. ........................................................ 117/952
[58] Field of Search ................................................ 117/952

[56] References Cited

U.S. PATENT DOCUMENTS

| | | | |
|---|---|---|---|
| 3,829,556 | 8/1974 | Logan et al. | 117/952 |
| 5,047,565 | 9/1991 | Jones et al. | 556/19 |
| 5,210,051 | 5/1993 | Carter, Jr. | 117/952 |
| 5,250,148 | 10/1993 | Nishizawa et al. | 156/611 |
| 5,268,327 | 12/1993 | Vernon et al. | 437/126 |
| 5,290,393 | 3/1994 | Nakamura | 117/952 |

FOREIGN PATENT DOCUMENTS

| | | | |
|---|---|---|---|
| 2400163 | 7/1975 | Germany | B01J 17/32 |
| 100832 | 2/1977 | Japan | B01J 17/28 |

OTHER PUBLICATIONS

Yamane, H., et al., Chemistry of Materials, vol. 9, No. 2, 413–416 (Feb. 1997).
Grzegory I., et al., J. Phys. Chem. Solids, 56, 639–647 (1995).
Karpinski, J., et al., J. Crystal Growth, 66, 1–10 (1984).
Chu, T. L., et al., J. Electrochem. Soc., 121, 159–162 (1974).
Elwell, D., et al., J. Crystal Growth, 66, 45–54 (1984).
Yamane, H., et al., J. Solid State Chem. 119, 375–379 (1995).
Yamane, H., et al., Acta Crystallogr., C52, 760–761 (1996).
Yamane, H., et al., J. Alloys Compd. 240, 33–36 (1996).
Yamane, H., et al., J. Alloys. Compd. 241, 69–74 (1996).

*Primary Examiner*—Benjamin Utech
*Assistant Examiner*—Duy Vu Deo

[57] ABSTRACT

A low temperature method for preparing GaN single crystals for use, for example, for blue light emitting diodes and laser diodes, comprises using sodium as a flux in a reaction system containing only gallium, sodium and nitrogen, e.g., by thermally decomposing sodium azide in a closed reaction zone containing gallium or by reacting gallium with nitrogen supplied from a tank in a closed reaction zone containing sodium, optionally in the presence of a catalytic amount of an alkaline earth metal.

3 Claims, 3 Drawing Sheets

LOW TEMPERATURE METHOD OF PREPARING GAN SINGLE CRYSTALS

This invention was made at least in part with Government support under National Science Foundation Grant DMR-8920583.

CROSS-REFERENCE TO RELATED APPLICATIONS

This application claims the benefit of U.S. Provisional Application No. 60/035,713, filed Jan. 17, 1997.

TECHNICAL FIELD

This invention is directed to preparation of GaN single crystals.

BACKGROUND OF THE INVENTION

Gallium nitride (GaN) single crystals have a wide direct bandgap (3.4 eV at 300K) and have been disclosed for use for blue light emitting diodes and laser diodes. See Maruska, H. P., et al., Appl. Phys. Lett. 15, 327–329 (1969); Morkoc, H., et al., Science 267, 51–55 (1995); and Morkoc, H., et al., J. Appl. Phys. 76, 1363–1398 (1994).

GaN dissociates before it sublimes or melts. Therefore single crystals of GaN cannot be prepared from a melt.

GaN single crystals have been reported as having been prepared by the reaction of Ga and $N_2$ under $N_2$ pressure of 8,000 to 17,000 atmospheres at temperatures ranging from 1,300° to 1,600° C. GaN single crystals have also been reported as having been grown at temperatures above 1,100° C. in vapor phase using $NH_3$ as a source of nitrogen. GaN crystals have also been reported as having been prepared by flowing a mixture of $NH_3$ and $H_2$ over a Ga melt at 900° to 1,000° C. The conditions for these methods are economically unsound.

SUMMARY OF THE INVENTION

It has been discovered herein that GaN single crystals can be obtained at lower temperatures than heretofore reported by utilizing sodium as a flux in a reaction system containing only gallium, sodium and nitrogen, optionally in the presence of an alkaline earth metal catalyst.

The method of the invention for preparing GaN single crystals comprises reacting gallium and nitrogen in a sodium flux at temperature ranging from 600° to 850° C., for example, from 600° to 800° C., in a reaction system containing only gallium, sodium and nitrogen, optionally in the presence of a catalytic amount of an alkaline earth metal, preferably by thermally decomposing sodium azide in a closed reaction zone containing gallium or by reacting gallium with nitrogen supplied from a tank in a closed reaction zone containing sodium.

DETAILED DESCRIPTION

Figure 1:
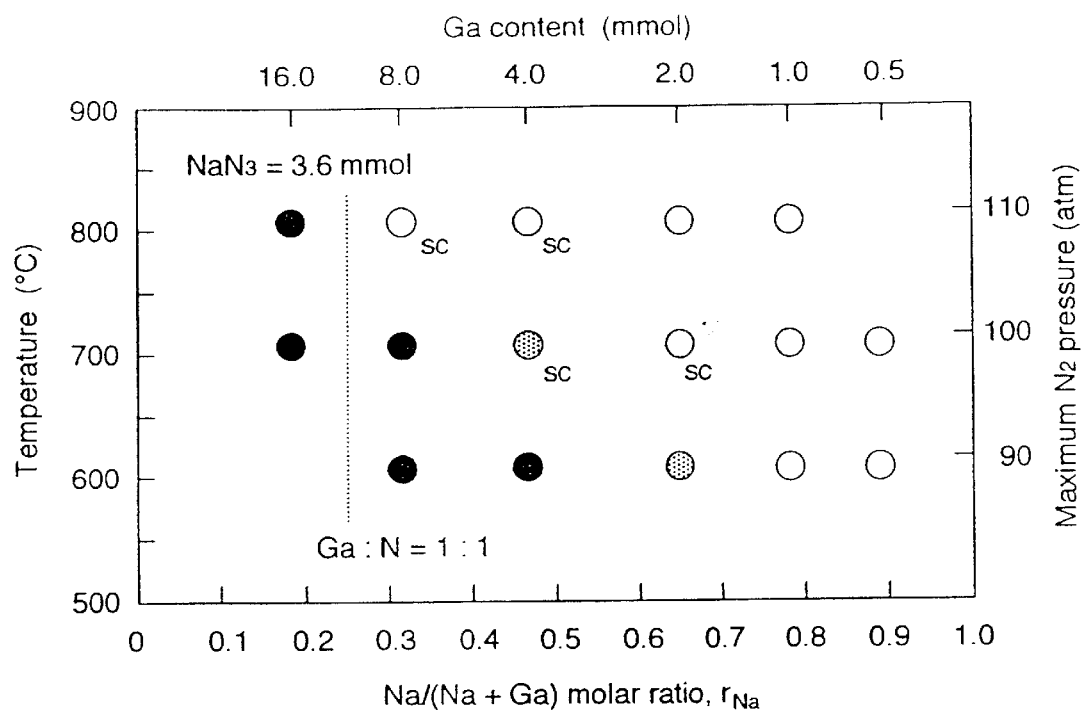
FIG. 1 is a graph with conditions and results denoted for runs in Example I where 3.6 mmol $NaN_3$ was used.

The molar ratio, Na/(Na+Ga), for the method herein, ordinarily should range from about 0.3 to about 1.0.

The reaction time for the method herein ordinarily should range from 20 to 200 hours or longer, for example, 20 to 100 hours.

The pressure (based on calculation of $N_2$ from $NaN_3$, the temperature employed and the volume of the reaction zone or based on the pressure of the nitrogen gas reactant in the reaction zone at the temperature employed) for the method herein is ordinarily less than 120 atmospheres, for example, from 50 to 115 atmospheres. Higher yields, 10 to 60%, have been found to be obtained where said pressure ranges from 90 to 110 atmospheres.

As indicated above, the reaction herein is optionally carried out in the presence of a catalytic amount of an alkaline earth metal, e.g., calcium, strontium or barium. Catalytic amounts can range, for example, from 0.002 to 0.05 moles of alkaline earth metal per mole of gallium.

The reaction zone is preferably loaded with gallium and sodium or sodium azide under an inert atmosphere.

Reaction with gallium present in amount of 10 grams or more, e.g., 10 to 20 grams, provides advantages. For reactions of this scale, the use of sodium azide as a source of sodium and nitrogen is impractical and rather gallium is preferably reacted with nitrogen supplied from a tank in a closed reaction zone containing sodium.

The substrate for crystal growth, i.e., the walls or portions of the walls of the reaction zone, can be, for example, stainless steel. The substrate for crystal growth can also be sapphire, e.g., in the form of a plate. Containers can be used inside the reaction vessel to prevent contamination of gallium nitride product by small amounts of iron or other elements from the vessel; such containers might be constructed of yttria or glassy carbon. Metallic tungsten, e.g., as a tungsten foil liner or container, may be used to control the amount of steel or other surface on which gallium nitride may form as gallium nitride does not readily form on tungsten under the conditions of the process herein.

After reaction, the resulting mixture is preferably allowed to cool to room temperature, and the reaction zone is opened, and the sodium metal is removed, e.g., by reaction with 2-propanol and ethanol or isopropyl alcohol.

GaN single crystals of maximum dimension above 0.1 mm have been prepared using temperatures ranging from 700° to 800° C. and pressures (calculated as described above) ranging from 100 to 110 atmospheres using sodium azide as a source of nitrogen and sodium.

GaN single crystals of maximum dimension averaging about 0.4 mm have been prepared using the process parameters of temperatures up to 750° C., sodium azide as a source of nitrogen and sodium, catalytic amounts of alkaline earth metal, and tungsten foil liner.

GaN single crystals of maximum dimension averaging about 2 mm have been prepared by using 15–20 grams of gallium and reacting the gallium with nitrogen supplied from a tank in a closed reaction zone containing sodium, at temperatures up to 810° C. and nitrogen pressures up to about 70 atmospheres.

GaN single crystals are expected to be ideal substrates for homoepitaxial GaN film growth.

Elements of the invention are disclosed in Yamane, H., et al., "Preparation of GaN single crystals using a Na flux," Chemistry of Materials, Vol. 9, pages 413 to 416 (1997), which is incorporated herein by reference.

The invention is illustrated by the following example.

EXAMPLE I

The starting materials were Ga (99.9999% purity) obtained from Sumitomo Chemical and $NaN_3$ (99.9% purity) obtained from Toyo Kasei Kogyo.

NaN₃ in amount of 0.117 g (1.8 mmol) or 0.234 g (3.6 mmol) and Ga, from 0.035 to 1.116 g (0.5–16.0 mmol), were weighed under $N_2$ atmosphere and sealed in a stainless steel tube (SUS 316, 7.5 mm inner diameter, 9.5 mm outer diameter, 100 mm length, volume of $4.4 \times 10^3$ mm³) with an arc welder. The sealed tube was placed in a furnace, and an $N_2$ atmosphere was employed in the furnace in order to prevent the oxidation of stainless steel during heating. Heating in the furnace was carried out at 600°–800° C. for 24–96 hours. After the heating, the sample in a tube was cooled to room temperature by shutting off the furnace power, and then the sealed tube was opened. The Na metal which covered the products containing GaN was removed by reaction with 2-propanol and ethanol. The products were characterized in air by X-ray diffraction. CuKα radiation was used on a diffractometer with a pyrolitic graphite monochrometor (Rigaku, RINT2000).

Results for the runs where 3.6 mmol $NaN_3$ was used and heating was carried out for 24 hours, are depicted in FIG. 1.

Figure 2:
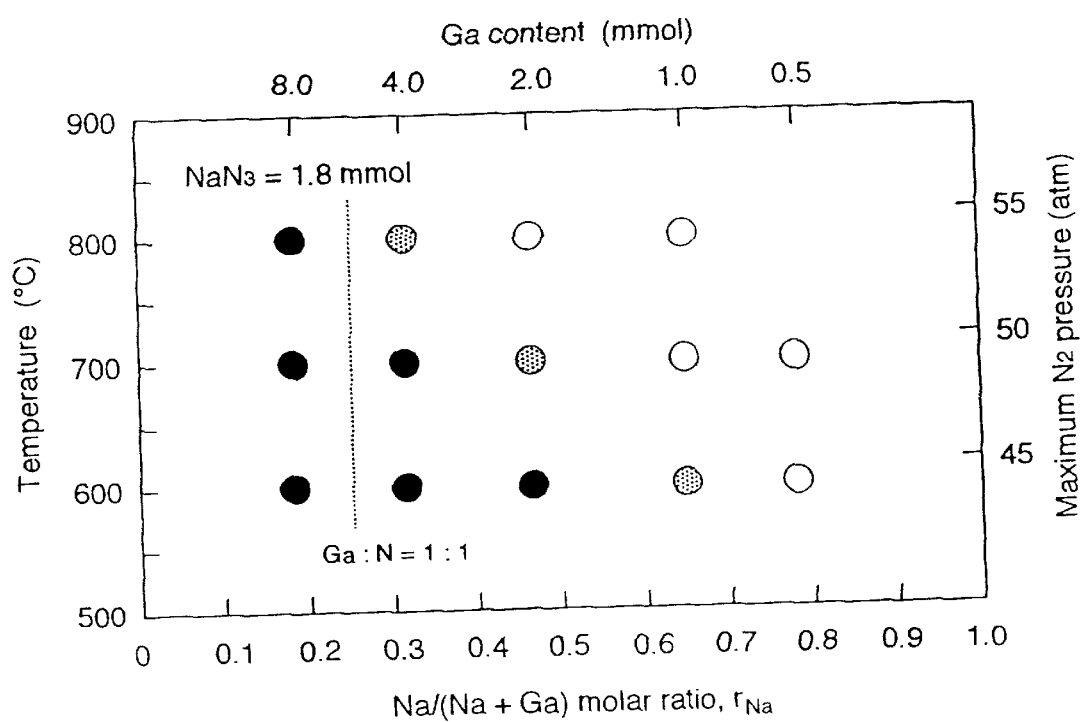
FIG. 2 is a graph with conditions and results denoted for runs in Example I where 1.8 mmol $NaN_3$ was used.

Results for the runs where 1.8 mmol $NaN_3$ was used and heating was carried out for 24 hours, are depicted in FIG. 2.

In FIGS. 1 and 2, the filled in circles denote Na–Ga compounds as product, the circles with dots therein denote Ga–Na compounds together with GaN as product, and the open circles denote GaN as product. The Na–Ga and Ga–Na compounds were intermetallic compounds of $Ga_4Na$ and/or $Ga_{13}Na_7$ and Ga. The designation "SC" in FIG. 1 indicates obtaining GaN single crystals with a size above 0.1 mm. The broken lines at Na/(Na+Ga) molar ratio equal to 0.25 indicate Ga:N molar ratio of 1:1.

As indicated in FIGS. 1 and 2, the GaN region spreads toward smaller Na/(Na+Ga) molar ratio with increasing temperature. The yields of GaN decreased with increasing Na/(Na+Ga) molar ratio and were from 10 to 60 mole percent (initial Ga basis) at $NaN_3$ amount equal to 3.6 mmol and 0.1 to 10 mol percent (initial Ga basis) at $NaN_3$ amount equal to 1.8 mmol.

GaN grain size increased with decreasing Na/(Na+Ga) molar ratio.

Figure 3:
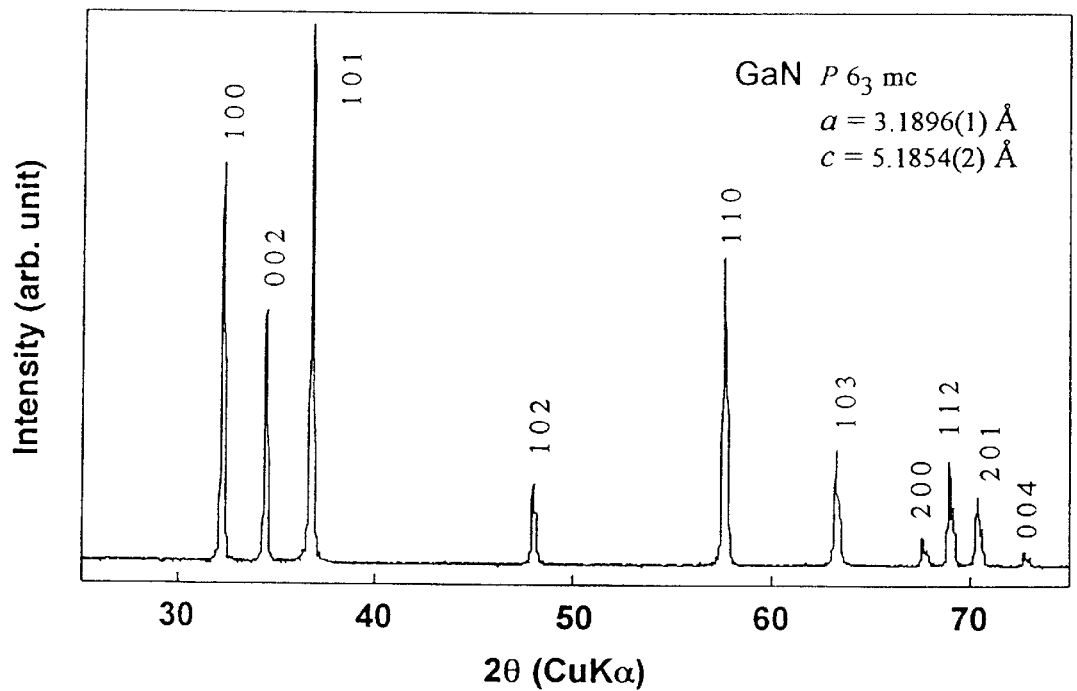
FIG. 3 depicts an X-ray diffraction pattern for GaN powder prepared in Example I where Na/(Na+Ga) molar ratio equals 0.78 and 800° C. was employed for 24 hours.

FIG. 3 shows the X-ray diffraction pattern of GaN powder prepared at Na/(Na+Ga) molar ratio=0.78° and 800° C. All peaks in the pattern were indexed with a hexagonal lattice, space group P $6_3$mc. The lattice parameters refined from the observed peak positions were a=3.1896(1) and c=5.1854(2) Å which agreed with the reported values.

Crystals obtained at 600° C. for 24 hours had particle sizes less than 0.1 mm but after 40 hours at Na/(Na+Ga) molar ratio of 0.64 had a particle size of greater than 0.2 mm.

GaN crystals were obtained after heating at 700° C. for 96 hours at Na/(Na+Ga) molar ratio of 0.31 and had a size of about 0.1 mm.

The product obtained after heating at 700° C. for 96 hours at Na/(Na+Ga) molar ratio of 0.47 with 3.6 mmol $NaN_3$, contained GaN crystals with a size of 1.0 to 2.0 mm.

The product obtained after heating at 700° C. for 24 hours at Na/(Na+Ga) molar ratio of 0.64 with 3.6 mmol $NaN_3$, contained platy crystals of size greater than 0.5 mm in width.

The products obtained after heating at 700° C. for 24 hours at Na/(Na+Ga) molar ratio of 0.78 contained GaN particles of about 0.1 μm; aggregates of GaN grains having facets and a size of about 3 μm were also contained in it.

The products obtained after heating at 800° C. for 24 hours with 3.6 mmol $NaN_3$ at Na/(Na+Ga) molar ratio of 0.47 contained platy agglomerates with granular GaN crystals with sizes about 0.2 mm.

The products obtained after heating at 800° C. for 24 hours with 3.6 mmol $NaN_3$ at Na/(Na+Ga) molar ratio of 0.31 contained GaN single crystals of 0.5 to 1.0 mm in size.

Crystals obtained at 700° C. were colorless and transparent except those at Na/(Na+Ga) molar ratio of 0.47 for reaction time of 96 hours were pale brownish and transparent and those at Na/(Na+Ga) of 0.3.1 for reaction time of 96 hours were black.

Crystals obtained at Na/(Na+Ga) molar ratio of 0.31 for reaction at 800° C. for 24 hours were greenish transparent and dark amber.

Oxygen and other impurity elements were not detected in the crystals by Augur electron spectroscopy and energy dispersive X-ray spectroscopy.

EXAMPLE II

An autoclave was constructed from a 7 inch length of stainless steel tubing (1 inch outer diameter, 0.120 inch wall thickness). The bottom end was sealed with a plug of stainless steel. The top end was fitted with a removable copper reflux condenser, to prevent sodium from migrating to the top. The top end was sealable with a Swagelock end piece, modified to allow the addition of gas from a cylinder. A tungsten disk, of diameter 0.750 inches and thickness 0.002 inches, was placed at the bottom of the autoclave, and the bottom 4 inches of the inner surface of the tube sidewall were covered with tungsten foil. The tungsten was used to limit nucleation of gallium nitride crystals on the walls of the autoclave.

Under inert argon atmosphere, the autoclave was loaded with 17.1168 g of elemental gallium (Cerac, 99.99% pure), 224.5 mg of strontium (Strem, purity N8 on a metals basis), and 9.1568 g of sodium metal (Aldrich, ACS reagent grade). The autoclave was sealed, inserted into a furnace, and attached to a nitrogen line. 400 psi (27 atmospheres) of nitrogen gas were admitted to the autoclave. The autoclave was heated over the course of 24 hours to temperature of 810° C. Upon reaching this temperature, the nitrogen pressure in the autoclave was increased to 1,000 psi (68 atmospheres). The temperature was maintained at 810° for eight days, at which time the furnace was shut off and the autoclave cooled over several hours. After venting the autoclave, the sodium was removed by reaction with isopropyl alcohol, and the resulting gallium nitride was washed with water.

Gallium nitride was found mainly along the sides of the tube. Fifteen crystals from this region were measured under a microscope. The longest dimension of each crystal was measured. The longest crystal of those chosen was 3.1 mm across; the average of all fifteen was 2.0 mm.

EXAMPLE III

The autoclave used was a stainless steel tube, 4.5 inches long (0.5 inch outer diameter, 0.035 inch wall thickness), sealed at one end. The other end was sealed with a stainless steel Swagelock end cap. The tube was loaded, under inert atmosphere, with 329.3 mg sodium azide (Aldrich, 99% pure), 589.6 mg elemental gallium (Cerac, 99.99% pure), and 8.0 mg barium metal (Aldrich, 99.9% pure on a metals basis). The autoclave was sealed and inserted into a furnace. The autoclave was heated over 12 hours to 750° C., kept at 750° C. for 100 hours, and allowed to cool over several hours. At 750° C., the nitrogen pressure in the autoclave is estimated to be 80 atmospheres maximum, i.e., before reaction takes place significantly. Sodium (formed by the decomposition of the azide) was removed by reaction with isopropyl alcohol and the product was washed with water. The crystals were measured under a microscope, with the largest crystal being 0.96 mm long and the average being 0.41 mm long.

EXAMPLE IV

An autoclave, of similar design to that used in Example III, was loaded with 328.6 mg sodium azide, 600.6 mg gallium metal, and a small triangular sapphire plate (roughly half of a ¼ inch square). Sources and purities for the reagents were the same as for Example III. The autoclave was sealed and heated in a manner similar to what was carried out in Example III, except that the maximum temperature reached was 740° C. The sodium was removed by reaction with isopropyl alcohol. Under a microscope, the sapphire piece looked slightly orangish, a color associated with gallium nitride produced by this method.

Variations will be obvious to those skilled in the art. Therefore, the scope of the invention is intended to be defined by the claims.

What is claimed is:

1. A method for preparing GaN single crystals which comprises reacting gallium and nitrogen in a sodium flux in a reaction system containing only gallium, sodium, and nitrogen, optionally in the presence of a catalytic amount of an alkaline earth metal.

2. The method of claim 1 where reaction is carried out in the presence of a catalytic amount of an alkaline earth metal.

3. The method of claim 1 which comprises carrying out the reaction in a reaction zone at least partly lined with metallic tungsten.

* * * * *